United States Patent
Kwon et al.

(10) Patent No.: US 8,045,406 B2
(45) Date of Patent: *Oct. 25, 2011

(54) LATENCY CIRCUIT USING DIVISION METHOD RELATED TO CAS LATENCY AND SEMICONDUCTOR MEMORY DEVICE

(75) Inventors: Sang-hyuk Kwon, Seoul (KR); Byung-hoon Jeong, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 18 days.

This patent is subject to a terminal disclaimer.

(21) Appl. No.: 12/697,547

(22) Filed: Feb. 1, 2010

(65) Prior Publication Data

US 2010/0128543 A1    May 27, 2010

Related U.S. Application Data

(63) Continuation-in-part of application No. 11/928,022, filed on Oct. 30, 2007, now Pat. No. 7,675,797.

(30) Foreign Application Priority Data

Oct. 31, 2006  (KR) .................. 10-2006-0106720
Jul. 27, 2007   (KR) .................. 10-2007-0075942
Aug. 31, 2009  (KR) .................. 10-2009-0081485

(51) Int. Cl.
*G11C 7/00* (2006.01)
*G11C 8/00* (2006.01)

(52) U.S. Cl. ..... 365/191; 365/193; 365/194; 365/233.1; 365/233.11

(58) Field of Classification Search .................. 365/191, 365/193, 194, 233.1, 233.11

See application file for complete search history.

(56) References Cited

U.S. PATENT DOCUMENTS

| | | | |
|---|---|---|---|
| 6,388,945 B2 | 5/2002 | Aikawa | |
| 6,426,900 B1 | 7/2002 | Maruyama et al. | |
| 7,027,352 B2 | 4/2006 | Jung | |
| 7,345,950 B2 | 3/2008 | Fujisawa et al. | |
| 7,675,797 B2 * | 3/2010 | Jeong et al. ................ | 365/193 |
| 7,869,288 B2 * | 1/2011 | Lee ........................... | 365/194 |
| 2002/0093871 A1 | 7/2002 | Kwak | |
| 2003/0218916 A1 * | 11/2003 | Kang ........................ | 365/193 |
| 2004/0109382 A1 | 6/2004 | Chung et al. | |
| 2005/0105377 A1 | 5/2005 | Kim et al. | |
| 2007/0147167 A1 * | 6/2007 | Chu ........................... | 365/233 |
| 2008/0101140 A1 * | 5/2008 | Jeong et al. ................ | 365/193 |

FOREIGN PATENT DOCUMENTS

| | | |
|---|---|---|
| JP | 2001283589 A | 10/2001 |
| JP | 2004258888 A | 9/2004 |
| KR | 1020010066128 A | 7/2001 |
| KR | 1020050041612 A | 5/2005 |
| KR | 1020070027126 A | 3/2007 |
| KR | 100791001 B1 | 1/2008 |

* cited by examiner

*Primary Examiner* — Ly D Pham
(74) *Attorney, Agent, or Firm* — Volentine & Whitt, PLLC

(57) ABSTRACT

A latency circuit for use in a semiconductor memory device includes a latency control clock generator generating an m-divided division signal from an external clock and at least one latency control clock from the m-divided division signal, wherein m is a natural number greater than or equal to 2. The latency circuit also includes a latency signal generator generating a latency signal in response to the at least one latency control clock, a latency control signal and an internal read command signal, wherein the latency control signal is generated from a column address strobe (CAS) latency and the internal read command signal is generated in response to a received read command.

20 Claims, 9 Drawing Sheets

LATENCY CIRCUIT USING DIVISION METHOD RELATED TO CAS LATENCY AND SEMICONDUCTOR MEMORY DEVICE

CROSS-REFERENCE TO RELATED APPLICATIONS

This is a continuation-in-part (CIP) of U.S. patent application Ser. No. 11/928,022 filed Oct. 30, 2007, the disclosure of which is hereby incorporated herein by reference in its entirety. In addition, this application claims the benefit of Korean Patent Application No. 10-2009-0081485 filed on Aug. 31, 2009, the subject matter of which is hereby incorporated by reference.

BACKGROUND

The inventive concept relates to semiconductor memory devices, and more particularly, to latency circuits incorporated within semiconductor memory devices, wherein the latency circuits are capable of generating a latency signal using a 1-division or 2-division method according to a column address strobe (CAS) latency.

Different types of semiconductor memory devices are used to implement various memories within a computer system or consumer electronic device (hereafter, generically referred to as "the system"). The speed at which data may be input to and output from a semiconductor memory device is a very important factor in determining the overall operating characteristics of the system. In order to increase overall operating speed of the system, synchronous dynamic random access memory (SDRAM) is commonly used. The SDRAM includes internal circuits that are synchronously controlled in relation to a clock signal generated within the system.

In order to increase its operating speed (or frequency), the SDRAM uses the so-called CAS latency function. CAS latency indicates the number of clock cycles between the time at which a read command is applied to the SDRAM device and the time at which corresponding data is output. Thus, the SDRAM reads data in response to a received read command, and then outputs the "read data" following the number of clock cycles defined by the CAS latency. For example, when a CAS latency is defined as 8 cycles, read data is output synchronously with an output clock eight (8) clock cycles following receipt of the read command.

A latency circuit is used to generate a latency signal. The latency signal is essentially an output control signal that determines when read data may be output from a SDRAM in response to a read command. Thus, the latency circuit may be viewed as a type of data output control (or output enabling) circuit. The data output buffer(s) typically associated with synchronous memory devices such as SDRAMs provide read data in response to the output clock signal during a period in while the latency signal is activated. Accordingly, after a read command is received, the latency circuit provides a latency signal before the predetermined number of clock cycles defined by the CAS latency has elapsed.

The latency signal may be generated as an internal read command signal generated by decoding a read command latched by the output clock signal (or clock signals derived from (i.e., delaying) the output clock signal). Conventionally, the pulse width of the internal read command signal corresponds to one (1) cycle of an external clock, and the output clock signal is generated in response to a delay locked loop (DLL) generated clock signal having the same frequency as the external clock.

When the frequency of the external clock increases, the timing margin between the internal read command signal and the output clock signal decreases. In other words, when the frequency of the external clock increases, the pulse width of the internal read command signal decreases, and the phase of the output clock signal precedes the pulse width of the internal read command signal. Also, the internal read command signal is related to (within the domain of) the external clock, and the output clock signal is related to (within the domain of) the DLL clock. Thus, a timing skew between these two domains may be affected by clock frequency variations, and variations in ambient environmental conditions such as pressure and temperature.

When the margin between the internal read command signal and the output clock signal decreases or the phase of the output clock signal precedes the pulse width of the internal read command signal, the internal read command signal cannot be normally latched, and thus a correct counting of clock cycles relative to the defined CAS latency is not possible. As a result, the internal read command signal is conventionally latched using a 2-divided output clock signal to thereby generate the latency signal. In this manner, the latency signal may be stably generated with respect to a high frequency external clock.

However, when the latency signal is thus generated by being regularly latched using the 2-divided output clock signals, and the semiconductor memory device is typically set to operate in a low frequency mode, such as CAS latency 5, and the latency signal is generated with a 1 lock cycle loss. In other words, in case like CAS latency 5, a 1-divided output clock signal is more suitable to the generation of the latency signal than the 2-divided output clock signal. Accordingly, a latency circuit capable of selectively using a 1-division or 2-division output clock signal according to CAS latency is required.

SUMMARY

Embodiments of the inventive concept provide a latency circuit capable of generating a latency signal using a 1-division or 2-division method according to a column address strobe (CAS) latency. Embodiments of the inventive concept also provide a semiconductor memory device including this type of latency circuit.

According to an aspect of the inventive concept, there is provided a latency circuit including: a latency control clock generator for generating an m-divided division signal by receiving an external clock, and generating at least one latency control clock from the m-divided division signal, wherein m is a natural number of at least 2; and a latency signal generator for generating a latency signal in response to the at least one latency control clock, a latency control signal and an internal read command signal, wherein the latency control signal is generated from a column address strobe (CAS) latency, and the internal read command signal is generated from a read command.

The latency signal generator may include: a controller for outputting the at least one latency control clock as it is or after inverting the at least one latency control clock, in response to the latency control signal; a first shift register unit for generating a first latch signal by latching the internal read command signal, in response to the at least one latency control clock; at least one switch for selectively transferring the first latch signal according to the CAS latency; and a second shift register unit for generating a second latch signal by latching the first latch signal transferred through the at least one switch, in response to an output of the controller.

The latency signal generator may further include a regulator for providing the second latch signal as the latency signal by outputting the second latch signal as it is or by delaying the second latch signal by one clock of the external clock, in response to the CAS latency.

The controller may include: a buffer for inputting the at least one latency control clock, in response to activation of the latency control signal; and an inverter for inputting the at least one latency control clock, in response to deactivation of the latency control signal, wherein the latency control signal is deactivated when the CAS latency is set to a low frequency operation of a semiconductor memory device.

The latency clock generator may include: a delay locked loop for generating a phase synchronization signal synchronized with the external clock by receiving the external clock; a clock divider for generating the m-divided division signal by 2-dividing the phase synchronization signal; a delay locked loop copier for receiving the m-divided division signal, and generating an output signal synchronized with the external clock by compensating for a delay time generated according to the delay locked loop; and an internal read command signal generation copier for receiving the output signal of the delay locked loop copier, and generating the at least one latency control clock by compensating for a delay time generated by the internal read command signal generator.

According to another aspect of the inventive concept, there is provided a semiconductor memory device including: an internal read command signal generator for generating an internal read command signal, in response to a read command synchronized with an external clock; a latency control clock generator for generating an m-divided division signal by receiving the external clock, and generating at least one latency control clock from the m-divided division signal, wherein m is a natural number of at least 2; a latency signal generator for generating a latency signal in response to the at least one latency control clock, a latency control signal and the internal read command signal, wherein the latency control signal is generated from a column address strobe (CAS) latency; and an output unit for controlling data output in response to the latency signal.

The latency control clock generator may include: a delay locked loop for generating a phase synchronization signal synchronized with the external clock by receiving the external clock; a phase regulator for transferring the phase synchronization signal to a clock divider by adjusting a phase of the phase synchronization signal; the clock divider for generating the m-divided division signal by 2-dividing the phase adjusted phase synchronization signal; a delay locked loop copier for receiving the division signal, and generating an output signal synchronized with the external clock by compensating for a delay time generated according to the delay locked loop; and an internal read command signal generation copier for receiving the output signal of the delay locked loop copier, and generating the at least one latency control clock by compensating for a delay generated by the internal read command signal generator.

The semiconductor memory device may further include a delay copy circuit for delaying the phase synchronization signal by a predetermined time so as to synchronize the phase synchronization signal with the latency signal, wherein the data output of the output unit is controlled in response to the latency signal and an output of the delay copy circuit.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF EMBODIMENTS

Certain embodiments of the inventive concept are illustrated in the attached drawings. However, the inventive concept may be variously embodied and should not be construed as being limited to only the illustrated embodiments. Rather the illustrated embodiments are presented as teaching examples. Throughout the drawings and written description, like reference numbers and labels are used to denote like or similar elements.

Figure 1:
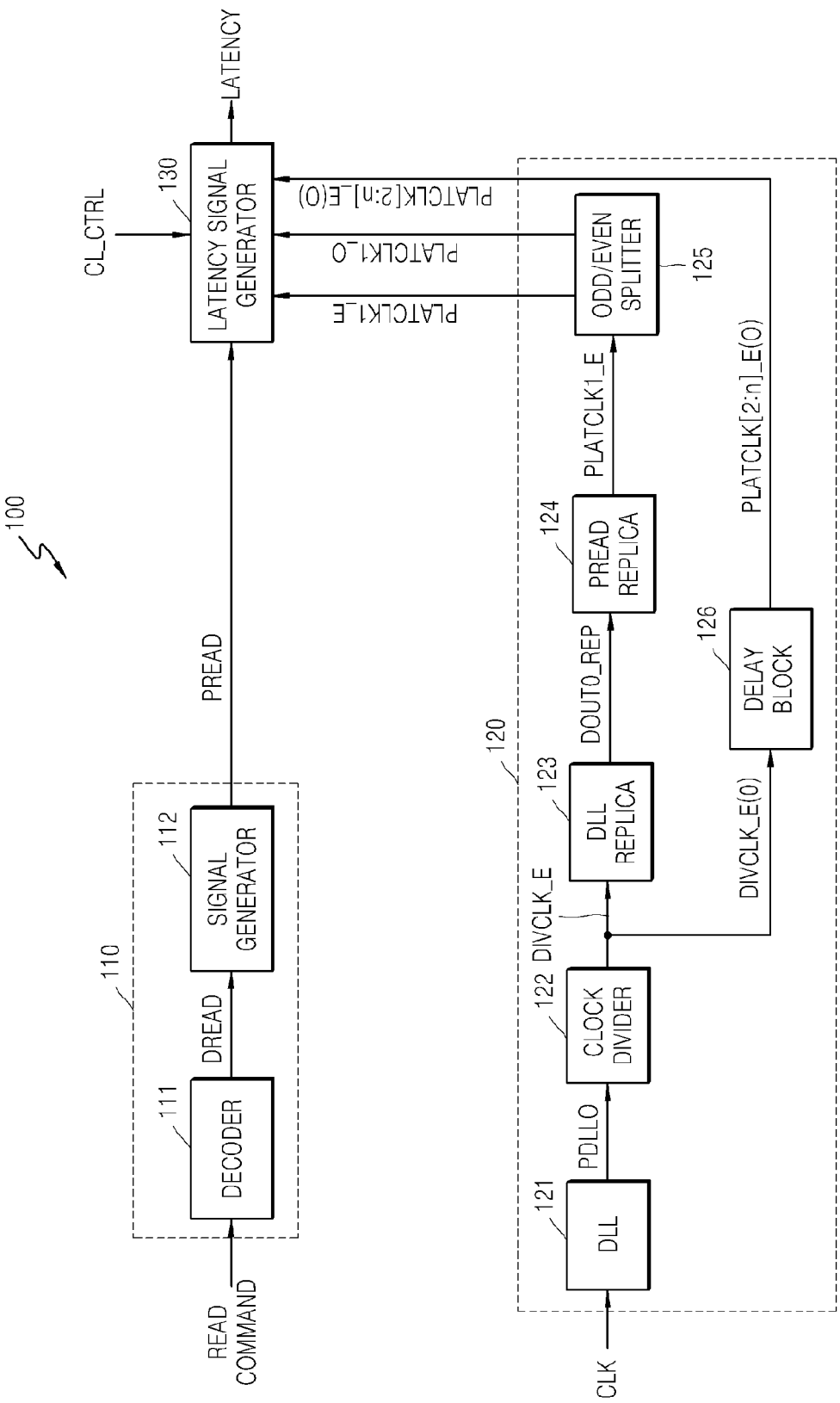
FIG. 1 is a block diagram illustrating a latency circuit according to an embodiment of the inventive concept.

FIG. 1 is a block diagram illustrating a latency circuit 100 according to an embodiment of the inventive concept. The latency circuit 100 comprises an internal read command signal generator 110, a latency control clock generator 120, and a latency signal generator 130.

The internal read command signal generator 110 includes a decoder 111, which receives and decodes a read command (READ COMMAND), and a signal generator 112, which generates and outputs an internal read command signal (PREAD) upon receiving an output signal (DREAD) from the decoder 111. The internal read command signal provided by the signal generator 112 is transmitted to the latency signal generator 130. The latency control clock 120 generates and provides a plurality of latency control clocks (PLATCLK[1:n]_E and PLATCLK[1:n]_O) to the latency signal generator 130.

The latency signal generator 130 receives the internal read command signal, the plurality of latency control clocks, and a latency control signal (CL_CTRL) and outputs a latency signal (LATENCY) generated by shifting the internal read command signal in response to the plurality of latency control clocks, and the latency control signal. The latency signal is used to control data output.

The latency control clock generator 120 includes a delay locked loop (DLL) 121, a clock divider 122, a copier (hereinafter, referred to as "DLL replica") 123 of the DLL 121, a copier (hereinafter, referred to as "PREAD replica") 124 of the internal read command signal generator 110, an odd/even splitter 125, and a delay block 126. In order to prevent the internal read command signal from being errantly or abnormally latched due to an increase in the frequency of an external clock (CLK), or change in ambient environmental conditions (e.g., process, voltage, and temperature—hereafter, "PVT variations"), the latency control clock generator 120 generates a first even latency control clock (PLATCLK1_E) having an absolute margin with respect to the internal read command signal using the PREAD replica 124. The latency control clock generator 120 generates the plurality of latency control clocks using division signals having a period twice that (2×) of the external clock as provided by the clock divider 122.

Upon receiving the external clock, the DLL 121 outputs a phase synchronization signal (PDLL0). The phase synchronization signal is provided to the clock divider 122, and in response the clock divider 122 outputs a division signal by "m"-dividing the phase synchronization signal, wherein "m" is an integer greater than or equal to 2. In certain embodiments of the inventive concept, the clock divider 122 is a circuit that 2-divides an input signal, wherein the 2-divided signal is derived from an even division signal (DIVCLK_E) and an odd division signal (DIVCLK_O) having opposite phases.

Either one of the even and odd division signals may be applied to the input of the DL replica 123. In the illustrated example of FIG. 1, the even division signal is applied to the input of the DLL replica 123. The DLL replica 123 thereupon delays the even division signal by a predetermined phase. In other words, a delay time (e.g., a defined period of time "tSAC") associated with the DLL 121 is compensated for by the DLL replica 123, and thus any timing delay resulting from the DLL 121 may be recovered. Accordingly, the output signal (DOUT0_REP) provided by the DLL replica 123 will be correctly synchronized with the external clock.

The output signal of the DLL replica 123 is applied to the input of the PREAD replica 124. In response, the PREAD replica 124 generates the first even latency control clock by delaying the output signal of the DLL replica 123 by a predetermined phase. The PREAD replica 124 may thus compensate for a phase delay associated with the internal read command signal generator 110. Here, the predetermined phase provided by the PREAD replica 124 delays the output signal of the DLL replica 124 is dependent upon a phase difference between the external clock and the internal read command signal. In other words, the predetermined phase is equal to a phase difference between an edge of the external clock at which the read command is received, and the internal read command signal generated by the internal read command signal generator 110. In certain embodiments of the inventive concept, the predetermined phase will be slightly less than the phase difference between the external clock and the internal read command signal.

The first even latency control clock provided by the PREAD replica 124 is applied to the odd/even splitter 125. Upon receiving the first even latency control clock, the odd/even splitter 125 additionally generates a first odd latency control clock (PLATCLK1_O) using the received first even latency control clock. In certain embodiments of the inventive concept, the first odd latency control clock and the first even latency control clock will have opposite phases. The odd/even splitter 125 provides the first even latency control clock (PLATCLK1_E) and the first odd latency control clock (PLATCLK1_O) to the latency signal generator 130.

Meanwhile, either the even division signal (DIVCLK_E) or the odd division signal (DIVCLK_O) is applied to the delay block 126. In response, the delay block 126 provides the second ($2^{nd}$) through nth latency control clocks (PLATCLK [2:n]_E(O)) to the latency signal generator 130.

In certain embodiments of the inventive concept, the delay block 126 comprises a first delay block configured to generate the $2^{nd}$ through nth even latency control clocks (PLATCLK [2:n]_E) by receiving and delaying the even division signal (DIVCLK_E), and a second delay block configured to generate the $2^{nd}$ through nth the odd latency control clocks (PLATCLK[2:n]_O) by receiving and delaying the odd division signal (DIVCLK_O). This particular configuration for the delay block 126 will be described in some additional detail hereafter.

The latency signal generator 130 receives the internal read command signal from the internal read command signal generator 110, the first even and odd latency control clocks and the $2^{nd}$ through nth latency control clocks from the latency control clock generator 120, and the latency control signal generated from column address strobe (CAS) latency information set in register units. Also, although not shown in FIG. 1, in certain embodiments of the inventive concept, the latency signal generator 130 may include a first shift register unit configured to shift the internal read command signal using the $1^{st}$ through nth even latency control clock, and a second shift register unit configured to shift the internal read command signal using the $1^{st}$ through nth odd latency control clock. Each one of the first and second shift register units in this particular arrangement may include a plurality of shift registers.

Thus, according to the latency circuit 100 of FIG. 1, the first even and odd latency control clocks provided by the latency control clock generator 120 have an absolute margin with respect to the internal read command signal. Accordingly, even when the frequency of the external clock increases or PVT variations arise in a semiconductor memory device, the internal read command signal may be stably latched on the edges of the first even and odd latency control clocks. Once the internal read command signal is stably latched, the delay block 126 may suitably adjust the delay amount so as to stably perform a following latch operation.

Also, since the plurality of latency control clocks (PLATCLK[1:n]_E(O)) provided by the latency control clock generator 120 is generated using the 2-divided signal, a frequency margin may be secured while latching the internal read command signal.

Figure 2:
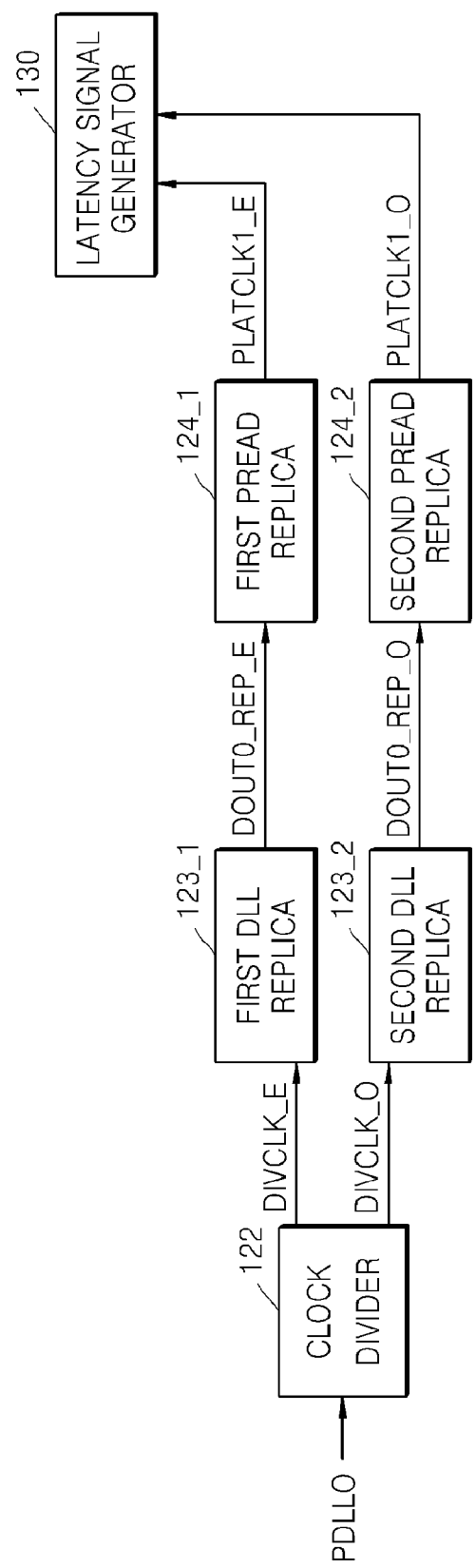
FIG. 2 is a block diagram further illustrating the generation of the first latency control clocks of FIG. 1.

FIG. 2 is a block diagram further illustrating the generation of the first even and odd latency control clocks within the embodiment of FIG. 1. Referring to FIG. 2, each of first and second DLL replicas 123_1 and 123_2, and first and second PREAD replicas 124_1 and 124_2 are respectively included for generation of the even and odd division signals, and the odd/even splitter 125 of FIG. 1 may be omitted. The clock divider 122 generates the even and odd division signals, wherein the even division signal is applied to the input of the first DLL replica 123_1, and the odd division signal is applied to the input of the second DLL replica 123-2. An output signal of the first DLL replica 123_1 (DOUT0_REP_E) is applied to the input of the first PREAD replica 124_1, and an output signal of the second DLL replica 123_2 (DOUT0_REP_O) is applied to the input of the second PREAD replica 124_2.

The first PREAD replica 124_1 generates the first even latency control clock by delaying the output signal of the first DLL replica 123_1. The second PREAD replica 124_2 generates the first odd latency control clock by delaying the output signal of the second DLL replica 123_2. The delay values applied by the first PREAD replica 124_1 and the second PREAD replica 124_2 are dependent upon the phase difference between the external clock and the internal read command signal, and compensate for a phase delay associated with the internal read command signal generator 110.

The first even latency control clock and the first odd latency control clock are provided to the latency signal generator 130. The latency signal generator 130 latches the internal read command signal using the first even and odd latency control clocks.

Figure 3:
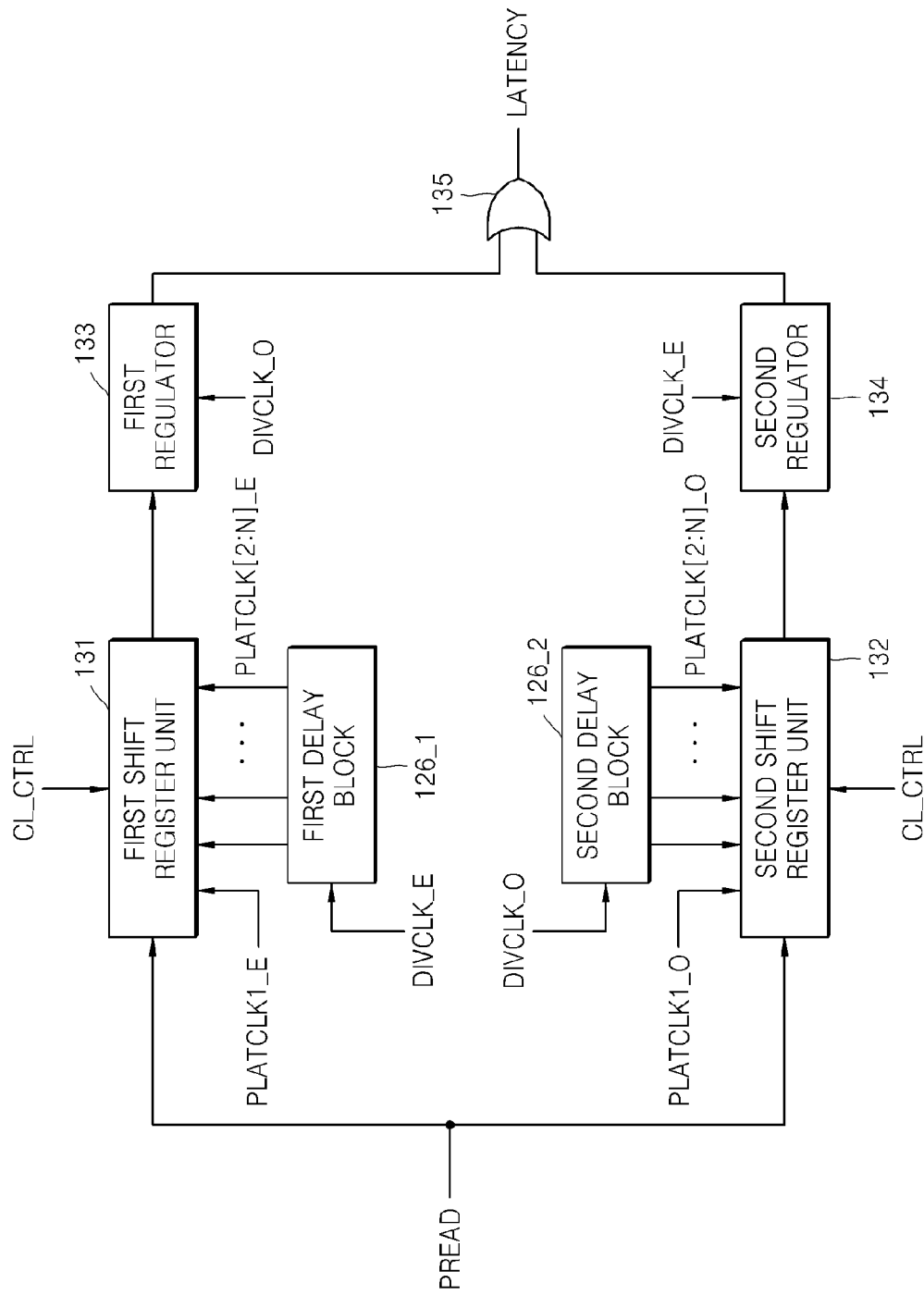
FIG. 3 is a block diagram further illustrating the latency signal generator and delay block of FIG. 1.

FIG. 3 is a block diagram further illustrating the latency signal generator 130 and delay block 126 of FIG. 1. Within the illustrated embodiment of FIG. 3, the latency signal generator 130 comprises a first shift register unit 131, a second shift register unit 132, a first regulator 133, a second regulator 134, and a logic device 135. The delay block 126 comprises a first delay block 126_1 and a second delay block 126_2.

Both the internal read command signal (PREAD) and the latency control signal (CL_CTRL) are applied as inputs to both the first shift register unit 131 and the second shift register unit 132. The first even latency control clock (PLATCLK1_E) and the $2^{nd}$ through nth even latency control clocks (PLATCLK[2:n]_E) are also applied as inputs to the first shift register unit 131. Upon receiving the even division signal (DIVCLK_E), the first delay block 126_1 generates the $2^{nd}$ through nth even latency control clocks (PLATCLK[2:n]_E).

The first odd latency control clock (PLATCLK1_O) and the $2^{nd}$ through nth odd latency control clocks (PLATCLK[2:n]_O) are applied as inputs to the second shift register unit 132. Upon receiving the odd division signal (DIVCLK_O), the second delay block 126_2 generates the $2^{nd}$ through nth odd latency control clocks (PLATCLK[2:n]_O).

In certain embodiments of the inventive concept, each one of the first and second shift register units 131 and 132 includes a plurality of shift registers. For example, the first shift register unit 131 may include "n" shift registers, wherein the $1^{st}$ through nth even latency control clocks respectively applied to corresponding clock terminals of the "n" shift registers.

In the first shift register unit 131, when the internal read command signal is applied to an input terminal of a first shift register, the first shift register shifts and outputs the internal read command signal synchronously with the first even latency control clock. The output of the first shift register is then applied to the input terminal of the second shift register which is series connected to the first shift register. The second shift register shifts and outputs the received signal synchronously with the second even latency control clock (PLATCLK2_E). The output signal of the second shift register is then applied to the input terminal of a third shift register, and so on, through the nth shift register.

Operation of the second shift register unit 132 are similar to that of the first shift register unit 131 described above, wherein the $1^{st}$ through nth odd latency control clocks are respectively applied to the clock terminals of the "n" shift registers forming the second shift register unit 132. In this manner, the collection of "n" shift registers shifts and outputs the internal read command signal synchronously with respective latency control clocks.

The first regulator 133 receives an output signal provided by the first shift register unit 131, and when a predetermined condition is satisfied, delays the output signal by one cycle of the external clock, and then outputs an "odd delayed output signal". For example, when the CAS latency of a semiconductor memory device is set to an odd number of cycles relative to the external clock, the first regulator 133 outputs the odd delayed output signal as the latency signal through OR gate 135. Alternatively, when the CAS latency is set to an even number of cycles relative to the external clock, the first regulator 133 delays the output signal provided by the first shift register unit 131, and outputs an "even delayed output signal" as the latency signal through OR gate 135.

The first regulator 133 operates in the above manner because, according to the illustrated embodiment of the inventive concept, the internal read command signal is shifted using a latency control clock having a cycle twice (2×) that of the external clock. Accordingly, an adjustment with respect to a shift corresponding to single clock cycle of the external clock is additionally required.

The first regulator 133 may therefore include a shift register and a logic device, such as an OR gate. Here, the odd division signal may be applied to the clock terminal of the shift register. A phase difference between a rising edge of the odd division signal (DIVCLK_O) and a rising edge of the even division signal (DIVCLK_E) corresponds to a single clock cycle of the external clock. Accordingly, the delay amount providing the latency signal may be adjusted to a single clock cycle degree of accuracy.

The operation of the second regulator 134 is similar to that of the first regulator 133. In other words, the second regulator 134 receives an output signal from the second shift register unit 132, and when a predetermined condition is satisfied, delays the received output signal by a clock of the external clock, and outputs either an odd or even delayed output signal. The even division signal (DIVCLK_E) may be applied to the clock terminal of a shift register included in the second regulator 134.

The OR gate (e.g., one example of a logic device) 135 provides either the delayed output signal of the first regulator 133 or the delayed output signal of the second regulator 134 as the latency signal. In other words, when the first shift register unit 131 is activated, the logic device 135 outputs the delayed output signal from the first regulator 133 as the latency signal, and when the second shift register unit 132 is activated, the logic device 135 outputs the delayed output signal of the second regulator 134 as the latency signal.

Figure 4:
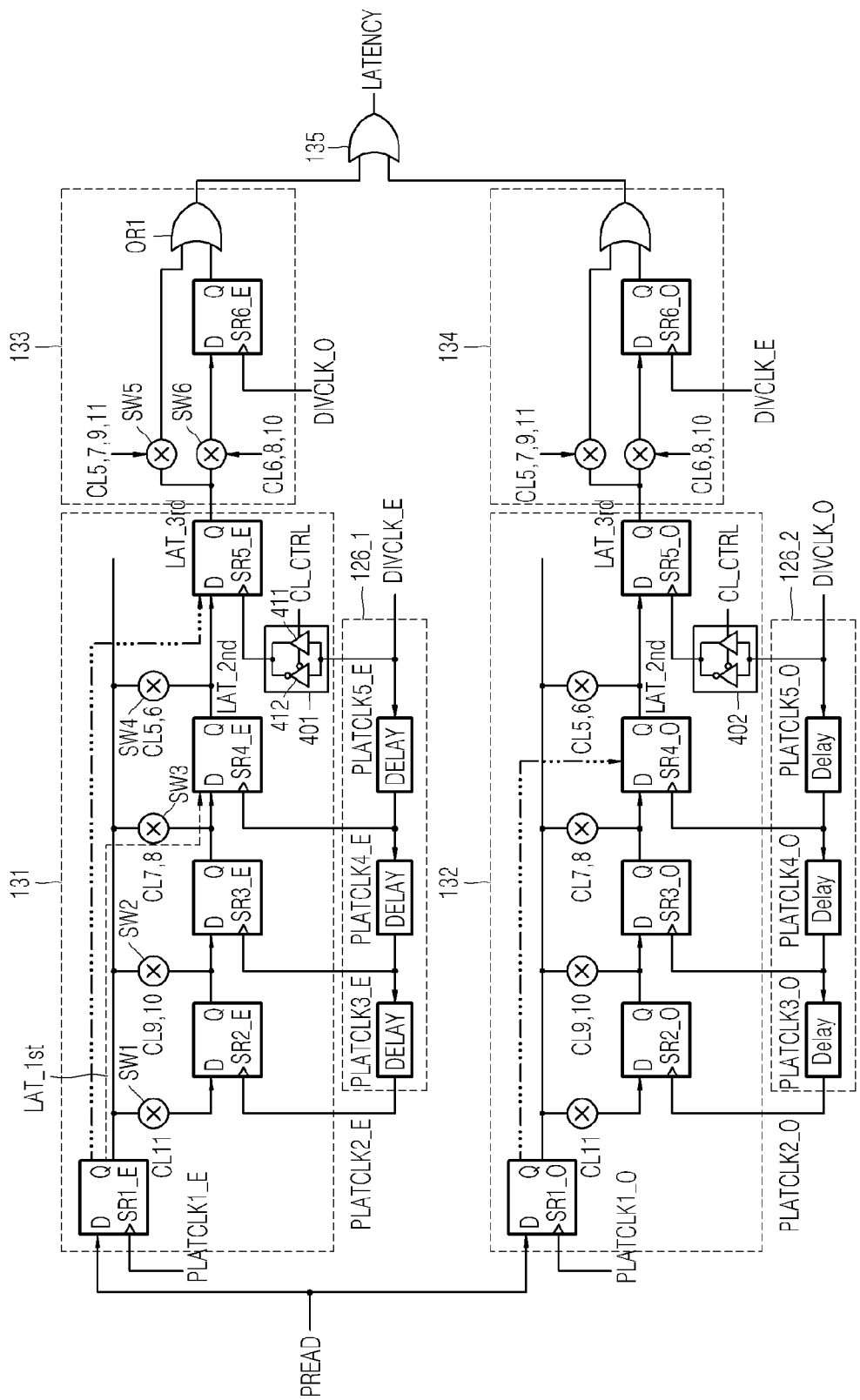
FIG. 4 is a logic circuit diagram further illustrating the first shift register unit, second shift register unit, first regulator, second regulator, first delay block, and second delay block of FIG. 3.

FIG. 4 is a circuit diagram further illustrating in one embodiment of the inventive concept the first shift register unit 131, second shift register unit 132, first regulator 133, second regulator 134, first delay block 126_1, and the second delay block 126_2 of FIG. 3. Referring to FIG. 4, the first shift register unit 131 comprises a plurality of shift registers SR1_E through SR5_E, a plurality of switches SW1 through SW4, and a first controller 401. The shift register SR1_E outputs a first latch signal LAT__1st by latching the internal read command signal, in response to the first even latency control clock (PLATCLK1_E). The first latch signal LAT__1st is connected to the switches SW1 through SW4, and the switches SW1 through SW4 each transfer the first latch signal LAT__1st to the shift registers SR2_E through SR5_E respectively, in response to respective CAS latency information CL5 and CL6, CL7 and CL8, CL9 and CL10, and CL11.

When the CAS latency information is 11 (CL11), the shift register SR2_E latches and outputs the first latch signal LAT__1st, in response to the second even latency control clock. An output of the shift register SR2_E is input to the shift register SR3_E.

The shift register SR3_E receives the output of the shift register SR2_E or the first latch signal LAT__1st. When the CAS latency information is 11 (CL11), the shift register SR3_E latches and outputs the output of the shift register SR2_E in response to the third even latency control clock (PLATCLK3_E), and when the CAS latency information is 9 or 10 (CL9 or CL10), the shift register SR3_E latches and outputs the first latch signal LAT__1st in response to the third even latency control clock. An output of the shift register SR3_E is input to the shift register SR4_E.

The shift register SR4_E receives the output of the shift register SR3_E or the first latch signal LAT__1st. When the CAS latency information is 9, 10, or 11 (CL9, CL10, or CL11), the shift register SR4_E latches and outputs the output of the shift register SR3_E in response to the fourth even latency control clock (PLATCLK4_E). When the CAS latency information is 7 or 8 (CL7 or CL8), the shift register SR4_E latches and outputs the first latch signal LAT__1st in response to the fourth even latency control clock. A second latch signal LAT__2nd, which is an output of the shift register SR4_E, is input to the shift register SR5_E.

The shift register SR5_E receives the second latch signal LAT__$2^{nd}$ or the first latch signal LAT__1st. When the CAS latency information is 7, 8, 9, 10, or 11 (CL7, CL8, CL9, CL10, or CL11), the shift register SR5_E latches and outputs the second latch signal LAT__$2^{nd}$ in response to the fifth even latency control clock (PLATCLK5_E). When the CAS latency information is 6 (CL6), the shift register SR5_E latches and outputs the first latch signal LAT__1st in response to the fifth even latency control clock. When the CAS latency information is 5 (CL5), the shift register SR5_E latches and outputs the first latch signal LAT__1st in response to the fifth odd latency control clock (PLATCLK5_O), which is an inverse signal of the fifth even latency control clock. A third latch signal LAT__3rd, which is an output of the shift register SR5_E, is an output of the first shift register unit 131, and is transferred to the first regulator 133.

The first controller 401 determines whether to transfer the fifth even latency control clock or the fifth odd latency control clock the shift register SR5_E in response to the latency control signal CL_CTRL. The first controller 401 includes a buffer 411 and an inverter 412, which receive the fifth even latency control clock. The buffer 411 is enabled in response to a logic high level of the latency control signal CL_CTRL, and the inverter 412 is enabled in response to a logic low level of the latency control signal CL_CTRL. The latency control signal CL_CTRL, for example, may be in the logic low level when the semiconductor memory device is set to a low frequency operation such as CAS latency 5 or below, and may be in the logic high level when the semiconductor memory device is set to a high frequency operation such as CAS latency 6 or above.

The first delay block 126_1 includes a plurality of delay blocks DELAY connected in series, and generates the fifth even latency control clock, the fourth even latency control clock, the third even latency control clock, and the second even latency control clock, which are delayed by predetermined times from the even division signal (DIVCLK_E).

Based on whether the CAS latency of the semiconductor memory device is set to an odd or even number of the external clock cycles, the first regulator 133 performs an additional adjustment with respect to a shift corresponding to a cycle of the external clock. The first regulator 133 includes switches SW5 and SW6, a shift register SR6_E, and a logic circuit OR1. When the CAS latency information is an odd number (CL5, 7, 9, or 11), the switch SW5 transfers the third latch signal LAT__3rd, which is the output of the first shift register unit 131, to the logic circuit OR1. When the CAS latency information is an even number (CL6, 8, or 10), the switch SW6 transfers the third latch signal LAT__3rd to the shift register SR6_E. The shift register SR6_E latches and outputs the third latch signal LAT__3rd in response to the odd division signal (DIVCLK_O). The logic circuit OR1 is formed of an OR gate, and outputs the third latch signal LAT__3rd transferred through the switch SW5 or the third latch signal LAT__3rd delayed by one clock of the external clock CLK by the shift register SR6_E as the latency signal.

The structures and operation of the second shift register unit 132, the second delay block 126_2, and the second regulator 134 are respectively similar to those of the first shift register unit 131, the first delay block 126_1, and the first regulator 133. However, the second shift register unit 132 and the second delay block 126_2 are different from the first shift register unit 131 and the first delay block 126_1 in that the second shift register unit 132 and the second delay block 126_2 are operated in response to the first through fifth odd latency control clocks (PLATCLK[1:5]_O), and the second regulator 134 is different from the first regulator 133 in that the second regulator 134 is operated in response to the even division signal (DIVCLK_E). In order to avoid repetition of description, detailed descriptions about the second shift register unit 132, the second delay block 126_2, and the second regulator 134 will be omitted.

Figure 5:
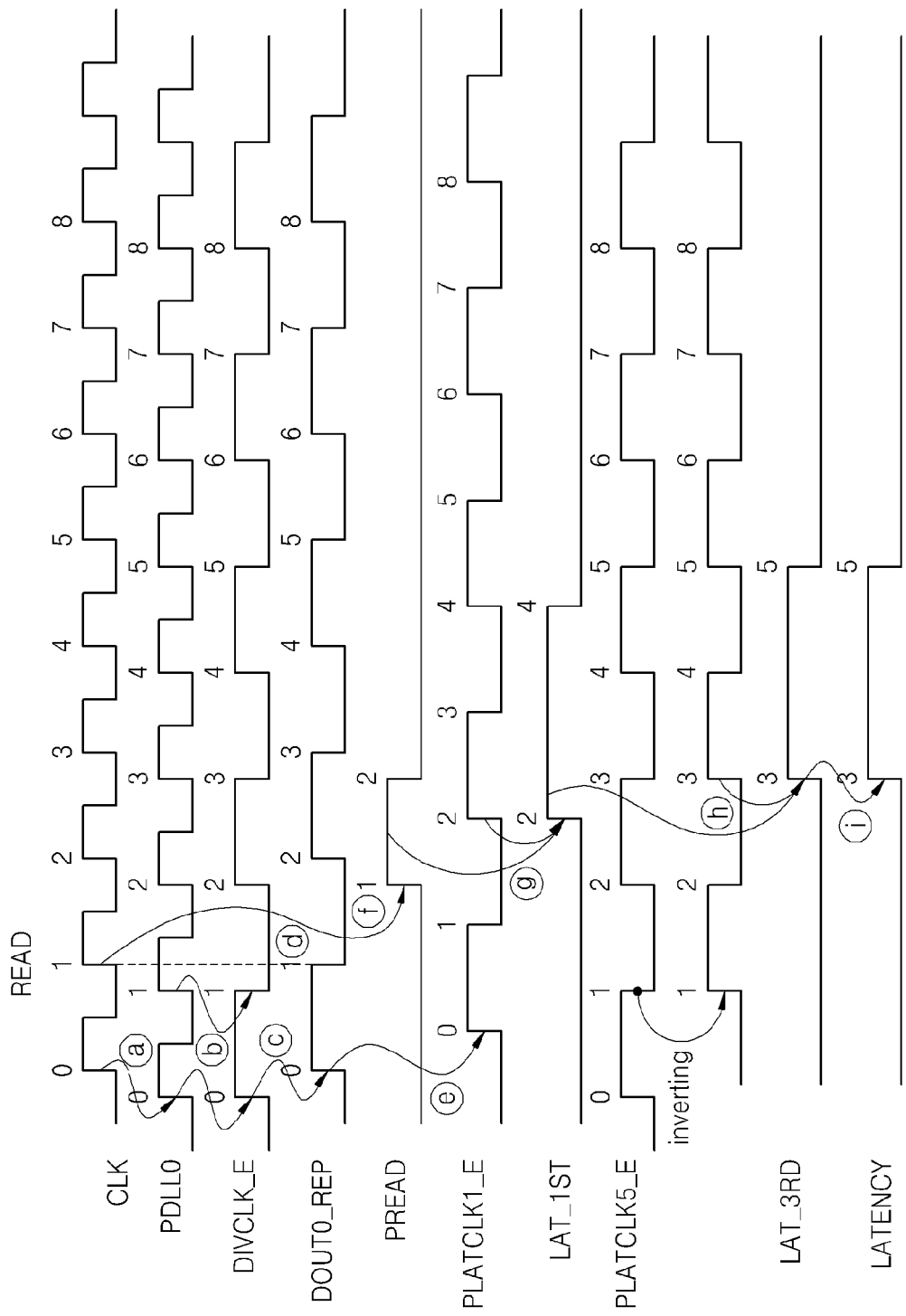
FIG. 5 is a timing diagram further describing the operation of the latency circuit of FIG. 1 while operating in column address strobe (CAS) latency 5.

FIG. 5 is a timing diagram further describing the operation of the latency circuit 100 of FIG. 1 which is assumed to be operating in CAS latency 5 mode. Referring to FIGS. 4 and 5, the switches SW1 through SW4 are selectively turned ON/OFF in response to the CAS latency information CL5, and a signal transmission path indicated by the arrow is generated. The phase synchronization signal (PDLL0) is generated by receiving the external clock (CLK) in operation ⓐ. Each rising edge of the external clock is numbered so as to indicate a corresponding relationship between each rising edge of the external clock and the other illustrated signals. The phase synchronization signal is 2-divided so as to generate the even division signal (DIVCLK_E) in operation ⓑ.

The output signal of the DDL replica 123 (DOUT0_REP) is generated in operation ⓒ according to the even division signal (DIVCLK_E), wherein the output signal of the DDL replica 123 is synchronized with the external clock through the DLL replica 123 in operation ⓓ. The output signal of the DDL replica 123 determines whether the internal read command signal is to be latched by an even latency control clock or an odd latency control clock. When the output signal of the DDL replica 123 has a rising edge at a clock cycle at which the read command is received, for example, a second edge CLK2 of the external clock, the internal read command signal may be latched by an even latency control clock. Alternatively, when the output signal of the DDL replica 123 has a falling edge, the internal read command signal may be latched by an odd latency control clock. The output signal of the DDL replica 123 is generated as the first even latency control clock (PLATCLK1_E) through the PREAD replica 124 in operation ⓔ.

The read command received at a first edge CLK1 of the external clock is generated as the internal read command signal PREAD in operation ⓕ. The internal read command signal PREAD is latched by the first even latency control clock, and thus is generated as the first latch signal LAT__1st in operation ⓖ.

The first latch signal LAT__1st is transferred to the shift register SR5_E through the switch SW4, and an inverse signal of the fifth even latency control clock (PLATCLK5_E) is transferred to the shift register SR5_E according to the latency control signal CL_CTRL having "low" logic level, that is, when CAS latency is 5. The fifth even latency control clock applied to the first controller 401 has the same waveform as the even division signal (DIVCLK_E). In response to the inverse signal of the fifth even latency control clock, the shift register SR5_E outputs the third latch signal LAT__3rd by latching the first latch signal LAT__1st, in operation ⓗ. The third latch signal LAT__3rd is generated as the latency signal in operation ⓘ through the switch SW5, the logic circuit OR1, and the logic device 135.

When CAS latency 5 is set, the latency signal is activated for 2 clock cycles at a third edge CLK3, (i.e. after 2 clocks from the first edge CLK1 upon receipt of the read command). Accordingly, a data output buffer (not shown) in the semiconductor memory device outputs data according to a sixth edge CLK6 of the external clock, in response to activation of the latency signal. As the latency signal is pre-activated from the third to the fifth edges CLK3 to CLK5 of the external clock, a read preamble that is set to prevent data collision is enabled.

Figure 6:
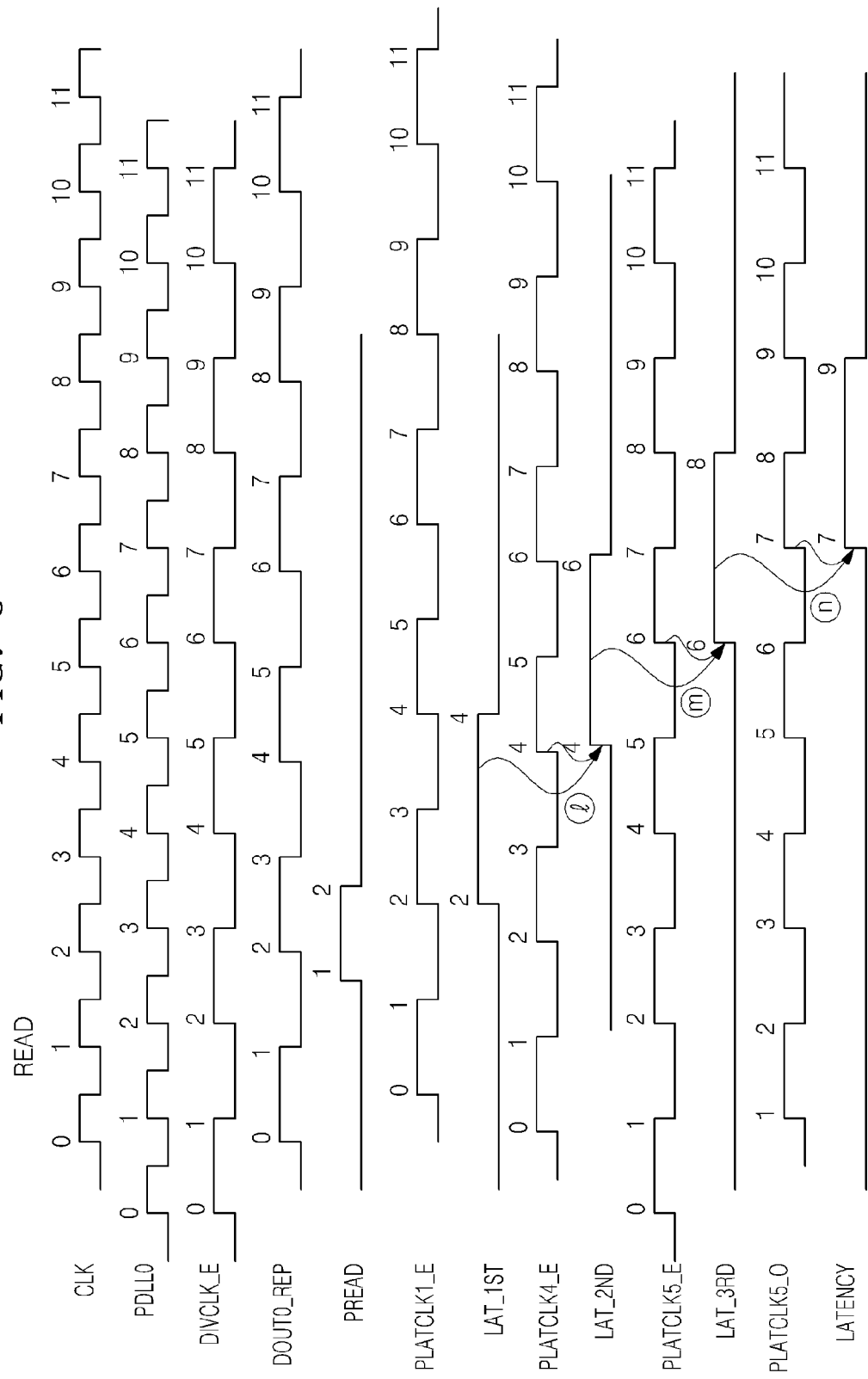
FIG. 6 is a timing diagram further describing operation of the latency circuit of FIG. 1 while operating in CAS latency 8.

FIG. 6 is a timing diagram further describing the operation of the latency circuit 100 of FIG. 1 which is now assumed to be operating in a CAS latency 8 mode. Referring to FIGS. 4 and 6, switches SW1 through SW4 are selectively turned on or off in response to CAS latency information CL8, and thus a signal transmission path indicated by the arrow direction is generated. Operations for generating the first latch signal LAT__1st by latching the read command received at the first edge CLK1 of the external clock are identical to the operations ⓐ through ⓖ of FIG. 4 described above, and thus description thereof will be omitted here. The fifth even latency control clock is generated through the first delay block 126_1 to which the even division signal is applied, and the fourth even latency control clock that is delayed by a predetermined time from the fifth even latency control clock is generated.

The first latch signal LAT__1st is transferred to the shift register SR4_E through the switch SW3. The shift register SR4_E outputs the second latch signal LAT__2nd by latching the first latch signal LAT__1st in response to the fourth even latency control clock in operation ⓛ. The shift register SR5_E outputs the third latch signal LAT__3rd by latching the second latch signal LAT__2nd in response to the fifth even latency control clock in operation ⓜ. The third latch signal LAT__3rd is transferred to the shift register SR6_E through the switch SW6. The shift register SR6_E latches and outputs the third latch signal LAT__3rd in response to the odd division signal in operation ⓝ.

When CAS latency 8 is set, the latency signal is activated for 2 clock cycles at a seventh edge CLK7, (i.e. after 6 clocks from the first edge CLK1 at which the read command is received). Accordingly, the data output buffer in the semiconductor memory device outputs data according to a ninth edge CLK9 of the external clock CLK, in response to activation of the latency signal. As the latency signal is pre-activated from the seventh edge CLK 7 to the ninth edge CLK9 of the external clock CLK, a read preamble is enabled.

The timing diagrams of FIGS. 5 and 6 illustrate two selected examples of the internal read command signal being latched by an even latency control clock. Alternatively, when the output signal DOUT0_REP of the DDL replica 123 has a falling edge, the internal read command signal will be latched by an odd latency control clock. Those skilled in the art will be able to understand this alternate latching of the internal read command signal by an odd latency control clock upon review of the foregoing explanation and FIGS. 5 and 6. Accordingly, a description of this alternate approach will be omitted.

Figure 7:
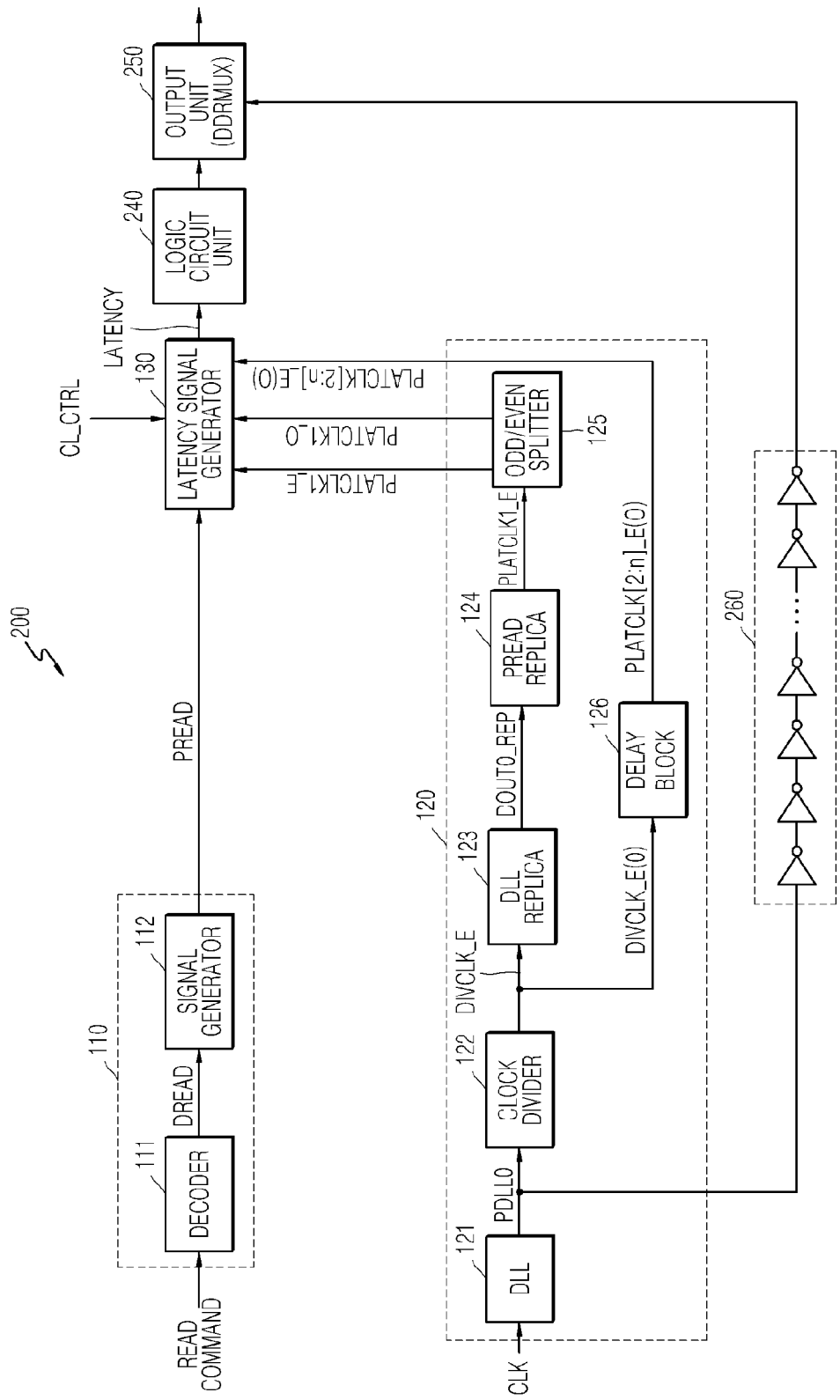
FIG. 7 is a block diagram illustrating a semiconductor memory device according to an embodiment of the inventive concept.

FIG. 7 is a block diagram illustrating a semiconductor memory device 200 according to an embodiment of the inventive concept. Similarly denoted elements between semiconductor memory device 100 and semiconductor memory device 200 are assumed to be similarly implemented and operated. Thus, their description will not be repeated here.

The DLL 121 in the latency control clock generator 120 included in the semiconductor memory device 200 generates the phase synchronization signal (PDLL0), wherein the phase synchronization signal is a signal synchronous with the external clock (CLK). The latency signal generator 130 receives the internal read command signal (PREAD) from the internal read command signal generator 110, and receives at least one of the $1^{st}$ through nth latency control clocks (PLATCLK[1: n]_ E(O)) from the latency control clock generator 120. The latency signal generator 130 outputs the latency signal (LATENCY) by shifting the internal read command signal in response to a plurality of latency control clocks. Here, the latency signal is used to control data output. The latency signal is provided to an output unit (e.g.,) double data rate multiplexer (DDRMUX) 250 via a logic circuit unit 240.

Meanwhile, while the output unit 250 controls the data output, stability must be maintained in the face of external clock signal variations and PVT variations. Accordingly, the phase synchronization signal is synchronized with the latency signal at the output unit 250. However, when the latency signal is generated based on the phase synchronization signal, the latency signal provided to the output unit 250 is delayed by a predetermined time from the phase synchronization signal due to a signal path formed between the latency control clock generator 120, latency signal generator 130, the logic circuit unit 240. Accordingly, in order to properly synchronize the phase synchronization signal with the latency signal at the output unit 250, the semiconductor memory device 200 further comprises a delay copy circuit 260 that delays a signal by a predetermined delay time.

The delay copy circuit 260 may require, (e.g.,) multiple delay stages formed by a plurality of series connected inverters. However, as the number of delay stages increases, excessive current may be consumed and the delay copy circuit 260 or the delay copy circuit 260 may become adversely affected by associated noise. Accordingly, the phase of the phase synchronization signal applied to the clock divider 122 is adjusted so that the phase adjusted phase synchronization signal may be divided. A phase regulator 127 for adjusting the phase of the phase synchronization signal may be disposed external to the clock divider 122' as shown in FIG. 8, or it may be included within the clock divider 122.

Figure 8:
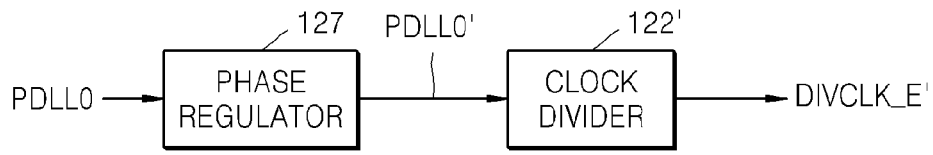
FIG. 8 is a block diagram further illustrating the phase regulator for synchronizing a phase synchronization signal to a latency signal in the output unit of FIG. 7.

FIG. 8 is a block diagram illustrating the use of the phase regulator 127 for synchronizing the phase synchronization signal with the latency signal in the output unit 250 of FIG. 7.

Referring to FIG. 8, the phase regulator 127 receives the phase synchronization signal (PDLL0), and outputs a phase adjusted phase synchronization signal (PDLL0') having a phase preceding the phase of the original phase synchronization signal. A clock divider 122' receives the phase adjusted phase synchronization signal, and outputs an even division signal (DIVCLK_E') by dividing the phase adjusted phase synchronization signal. The even division signal DIVCLK_E' having a phase preceding the even division signal (DIVCLK_E) may be generated as previously described in relation to the clock divider 122.

Figure 9:
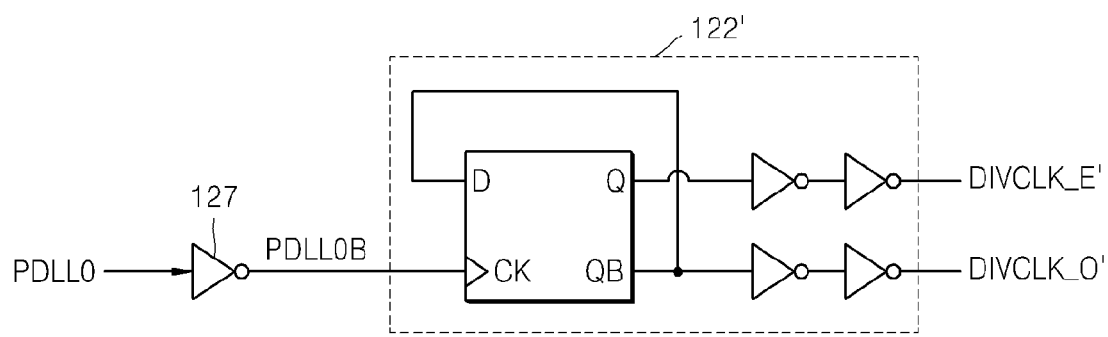
FIG. 9 is a circuit diagram further illustrating the phase regulator and clock divider of FIG. 8.

FIG. 9 is a circuit diagram further describing the operation of the phase regulator 127 and the clock divider 122' of FIG. 8. Referring to FIG. 9, the phase regulator 127 is formed by a single inverter. The inverter receives the phase synchronization signal, and inverts and outputs the phase adjusted phase synchronization signal as a logical complement to the phase synchronization signal (PDLL0B). The complementary phase synchronization signal (PDLL0B) having an inverted phase from the phase synchronization signal (PDLL0) is then applied to the clock divider 122'. The clock divider 122' generates the even division signal (DIVCLK_E') and an odd division signal (DIVCLK_O') which are 2-divided based on the signal PDLL0B.

Figure 10:
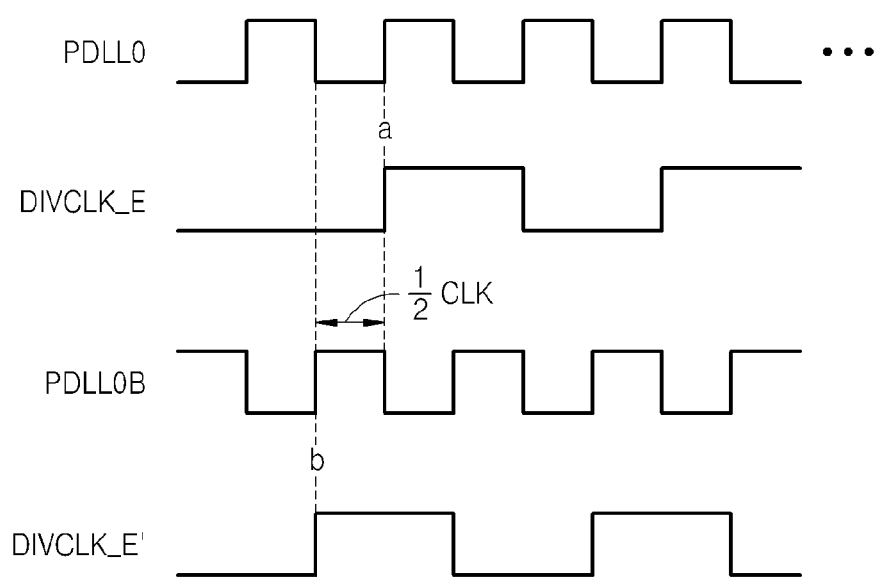
FIG. 10 is a timing diagram further describing the operation of the phase regulator and clock divider of FIG. 9.

FIG. 10 is a timing diagram further describing the operation of the phase regulator 127 and clock divider 122' of FIG. 9. Referring to FIG. 10, the complementary phase synchronization signal (PDLL0B) has a phase that precedes by 180° the phase synchronization signal (PDLL0) (i.e., it precedes the external clock by one half cycle or ½ CLK). Accordingly, if the even division signal (DIVCLK_E) generated by 2-dividing the phase synchronization signal is logically "high" at time "a", whereas the adjusted even division signal (DIVCLK_E') generated by 2-dividing the complementary phase synchronization signal (PDLL0B) is high at time "b"–½ CLK before time "a". In other words, the adjusted even division signal DIVCLK_E' has a phase preceding the even division signal DIVCLK_E by 180°.

It should be noted, however, that phase of the phase synchronization signal may be adjusted by more or less than 180°, and the embodiments of the inventive concept illustrated in FIGS. 8-10 are merely one possible example of competent phase adjustment of the phase synchronization signal.

Figure 11:
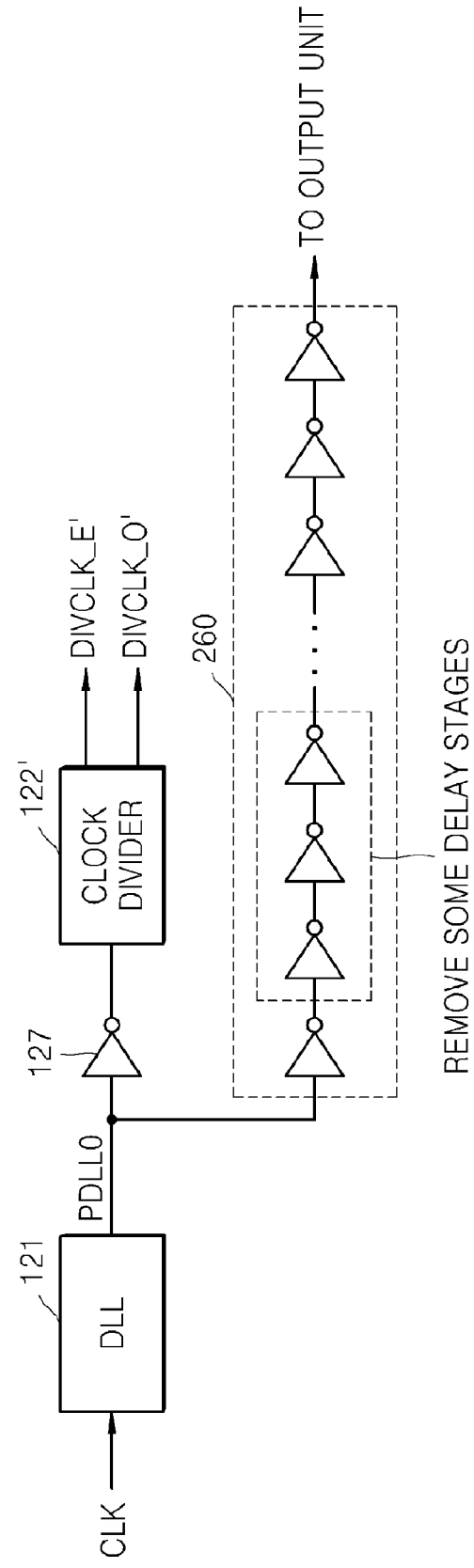
FIG. 11 is a block diagram illustrating a relevant portion of a semiconductor memory device and further describing decreasing the number of delay stages in a delay copy circuit of FIG. 7 by using the phase regulator of FIG. 8.

FIG. 11 is a block diagram illustrating a relevant portion of the semiconductor memory device 200 and further describing a process whereby the number of delay stages in the delay copy circuit 260 of FIG. 7 may be reduced using the phase regulator 127 of FIG. 8. Referring to FIG. 11, the phase synchronization signal provided by the DLL 121 is applied to the delay copy circuit 260. As above, the phase regulator 127 is assumed to provide the complementary phase synchronization signal by inverting the phase of the phase synchronization signal. The clock divider 122' then generates the adjusted even division signal (DIVCLK_E') and an adjusted odd division signal (DIVCLK_O') which are 2-divided from the complementary phase synchronization signal. The adjusted even division signal DIVCLK_E' and the adjusted odd division signal DIVCLK_O' precede by one half cycle (½CLK) of the external clock the phase synchronization signal. Similarly, the latency signal generated using the latency control clocks (e.g., PLATCLK[1:n]_E and PLATCLK[1:n]_O) generated based on the adjusted even division signal DIVCLK_E' will also precede by one half cycle (½CLK) the external clock.

Accordingly, a delay provided to the phase synchronization signal by the delay copy circuit 260 may decreased. As the amount of applied delay is decreased, the number of delay stages in the delay copy circuit 260 may also be decreased. Consequently, noise and current consumption arising from the operation of the delay copy circuit 260 may be reduced.

While the inventive concept has been particularly shown and described with reference to exemplary embodiments thereof, it will be understood that various changes in form and details may be made therein without departing from the scope of the following claims.

What is claimed is:

1. A latency circuit adapted for use in a semiconductor memory device, the latency circuit comprising:
   a latency control clock generator configured to generate an m-divided division signal from an external clock, and generate at least one latency control clock from the m-divided division signal, wherein m is a natural number greater than or equal to 2; and
   a latency signal generator configured to generate a latency signal in response to the at least one latency control clock, a latency control signal and an internal read command signal, wherein the latency control signal is generated from a column address strobe (CAS) latency and the internal read command signal is generated in response to a received read command.

2. The latency circuit of claim 1, wherein the latency signal generator comprises:
   a controller configured to generate the at least one latency control clock in response to the latency control signal, wherein the at least one latency control signal is generated normally or inverted;
   a first shift register unit configured to generate a first latch signal by latching the internal read command signal in response to the at least one latency control clock;
   at least one switch configured to selectively transfer the first latch signal according to the CAS latency; and
   a second shift register unit configured to generate a second latch signal by latching the first latch signal transferred through the at least one switch in response to an output provided by the controller.

3. The latency circuit of claim 2, wherein the latency signal generator further comprises:
   a regulator configured to provide the second latch signal as the latency signal by outputting the second latch signal in response to the CAS latency, wherein the latency signal is the second latch signal or the second latch signal delayed by one cycle of the external clock.

4. The latency circuit of claim 2, wherein the controller comprises:
   a buffer configured to input the at least one latency control clock in response to activation of the latency control signal; and
   an inverter configured to input the at least one latency control clock in response to deactivation of the latency control signal,
   wherein the latency control signal is deactivated when the CAS latency is set to a low frequency operation for the semiconductor memory device.

5. The latency circuit of claim 1, wherein the latency clock generator comprises:
   a delay locked loop (DLL) configured to generate a phase synchronization signal synchronized with the external clock;
   a clock divider configured to generate the m-divided division signal by 2-dividing the phase synchronization signal;
   a DLL copier configured to receive the m-divided division signal and generate an output signal synchronized with the external clock by compensating for a delay time associated with the delay locked loop; and
   an internal read command signal generation copier configured to receive the output signal provided by the delay locked loop copier and generate the at least one latency control clock by compensating for a delay time associated with the internal read command signal generator.

6. The latency circuit of claim 5, wherein the at least one latency control clock generated by the internal read command signal generation copier comprises one of a first odd latency control clock and a first even latency control clock; and the latency clock generator further comprises:
   an even/odd splitter configured to receive the one of the first odd latency control clock and the first even latency control clock and generate the other one of the first odd latency control clock and the first even latency control clock.

7. The latency circuit of claim 1, wherein the latency clock generator comprises:
   a delay locked loop (DLL) configured to generate a phase synchronization signal synchronized with the external clock;
   a clock divider configured to generate an even division signal and an odd division signal having opposite phases by dividing the phase synchronization signal;
   a first DLL copier configured to receive the even division signal and provide an even output signal to a first internal read command signal generation copier, wherein the first internal read command signal generation copier is configured to generate an even latency control clock in response to the even output signal; and
   a second DLL copier configured to receive the odd division signal and provide an odd output signal to a second internal read command signal generation copier, wherein the second internal read command signal generation copier is configured to generate an odd latency control clock in response to the odd output signal, wherein the even latency control clock and odd latency control clock are applied to the latency signal generator as the at least one latency control clock, such that the latency signal generator latches the internal read command signal using the even and odd latency control clocks.

8. The latency circuit of claim 6, wherein the even latency control clock and odd latency control clock provide an absolute margin with respect to the internal read command signal.

9. A semiconductor memory device comprising:
an internal read command signal generator configured to generate an internal read command signal in response to a read command synchronously received in relation to an external clock;
a latency control clock generator configured to generate a phase synchronization signal from the external clock and generate at least one latency control clock signal by m-dividing the phase synchronization signal, wherein m is a natural number greater than or equal to 2; and
a latency signal generator configured to generate a latency signal in response to the at least one latency control clock, a latency control signal and an internal read command signal, wherein the latency control signal is generated from a column address strobe (CAS) latency and the internal read command signal is generated in response to a received read command; and
an output unit configured to output read data in response to the internal read command signal and the latency signal.

10. The semiconductor memory device of claim 9, wherein the latency signal generator comprises:
a controller configured to generate the at least one latency control clock in response to the latency control signal, wherein the at least one latency control signal is generated normally or inverted;
a first shift register unit configured to generate a first latch signal by latching the internal read command signal in response to the at least one latency control clock;
at least one switch configured to selectively transfer the first latch signal according to the CAS latency; and
a second shift register unit configured to generate a second latch signal by latching the first latch signal transferred through the at least one switch in response to an output provided by the controller.

11. The semiconductor memory device of claim 10, wherein the latency signal generator further comprises:
a regulator configured to provide the second latch signal as the latency signal by outputting the second latch signal in response to the CAS latency, wherein the latency signal is the second latch signal or the second latch signal delayed by one cycle of the external clock.

12. The semiconductor memory device of claim 10, wherein the controller comprises:
a buffer configured to input the at least one latency control clock in response to activation of the latency control signal; and
an inverter configured to input the at least one latency control clock in response to deactivation of the latency control signal,
wherein the latency control signal is deactivated when the CAS latency is set to a low frequency operation for the semiconductor memory device.

13. The semiconductor memory device claim 9, wherein the latency clock generator comprises:
a delay locked loop (DLL) configured to generate the phase synchronization signal;
a clock divider configured to 2-divide the phase synchronization signal;
a DLL copier configured to receive the 2-divided phase synchronization signal and generate an output signal synchronized with the external clock by compensating for a delay time associated with the delay locked loop; and
an internal read command signal generation copier configured to receive the output signal provided by the delay locked loop copier and generate the at least one latency control clock by compensating for a delay time associated with the internal read command signal generator.

14. The semiconductor memory device of claim 13, wherein the at least one latency control clock generated by the internal read command signal generation copier comprises one of a first odd latency control clock and a first even latency control clock; and the latency clock generator further comprises:
an even/odd splitter configured to receive the one of the first odd latency control clock and the first even latency control clock and generate the other one of the first odd latency control clock and the first even latency control clock.

15. The semiconductor memory device of claim 13, further comprising:
a phase regulator disposed between the DLL and the clock divider, and configured to phase adjust the phase synchronization signal.

16. The semiconductor memory device of claim 9, wherein the latency clock generator comprises:
a delay locked loop (DLL) configured to generate the phase synchronization signal;
a clock divider configured to generate an even division signal and an odd division signal having opposite phases by dividing the phase synchronization signal;
a first DLL copier configured to receive the even division signal and provide an even output signal to a first internal read command signal generation copier, wherein the first internal read command signal generation copier is configured to generate an even latency control clock in response to the even output signal; and
a second DLL copier configured to receive the odd division signal and provide an odd output signal to a second internal read command signal generation copier, wherein the second internal read command signal generation copier is configured to generate an odd latency control clock in response to the odd output signal,
wherein the even latency control clock and odd latency control clock are applied to the latency signal generator as the at least one latency control clock, such that the latency signal generator latches the internal read command signal using the even and odd latency control clocks.

17. The semiconductor memory device of claim 16, wherein the even latency control clock and odd latency control clock provide an absolute margin with respect to the internal read command signal.

18. The semiconductor memory device of claim 9, further comprising:
a delay copy circuit configured to receive the phase synchronization signal and synchronize the phase synchronization signal with the latency signal by delaying the phase synchronization signal by a predetermined delay time.

19. The semiconductor memory device of claim 18, wherein the delay copy circuit comprises a plurality of delay stages.

20. The semiconductor memory device of claim 19, wherein the plurality of delay stages is a plurality of series connected inverters.

* * * * *